US012164977B2

(12) United States Patent
Guim Bernat et al.

(10) Patent No.: US 12,164,977 B2
(45) Date of Patent: Dec. 10, 2024

(54) ADVANCED QUEUE MONITORING SYSTEM

(71) Applicant: Intel Corporation, Santa Clara, CA (US)

(72) Inventors: Francesc Guim Bernat, Barcelona (ES); Karthik Kumar, Chandler, AZ (US); Patrick G. Kutch, Tigard, OR (US); Alexander Bachmutsky, Sunnyvale, CA (US); Nicolae Octavian Popovici, Bretten (DE)

(73) Assignee: Intel Corporation, Santa Clara, CA (US)

( * ) Notice: Subject to any disclaimer, the term of this patent is extended or adjusted under 35 U.S.C. 154(b) by 804 days.

(21) Appl. No.: 17/133,112

(22) Filed: Dec. 23, 2020

(65) Prior Publication Data
US 2022/0197729 A1    Jun. 23, 2022

(51) Int. Cl.
*G06F 9/54* (2006.01)
*G06F 11/30* (2006.01)
*G06F 11/34* (2006.01)
*G06F 12/06* (2006.01)
*G06F 30/392* (2020.01)
*G06Q 10/101* (2023.01)
*H04L 41/50* (2022.01)

(52) U.S. Cl.
CPC .............. *G06F 9/546* (2013.01); *G06F 9/542* (2013.01); *G06F 11/3024* (2013.01); *G06F 11/3495* (2013.01); *G06F 12/06* (2013.01); *G06F 30/392* (2020.01); *G06F 2209/548* (2013.01); *G06F 2212/1008* (2013.01); *G06Q 10/101* (2013.01); *H04L 41/50* (2013.01)

(58) Field of Classification Search
CPC ...... G06F 9/546; G06F 9/542; G06F 11/3024; G06F 11/3495; G06F 12/06; G06F 30/392; G06F 2209/548; G06F 2212/1008; G06F 11/3409; G06F 2201/81; G06F 2201/815; G06F 2201/865; G06F 2209/5011; G06F 2209/5018; H04L 41/50; H04L 43/0876; G06Q 10/101
See application file for complete search history.

(56) References Cited

U.S. PATENT DOCUMENTS

| 10,547,559 | B2 | 1/2020 | Vasudevan et al. | |
| 2003/0126186 | A1* | 7/2003 | Rodgers ................ | G06F 9/3851 718/107 |
| 2004/0013124 | A1* | 1/2004 | Peebles ............... | H04L 49/3045 370/412 |
| 2008/0120620 | A1* | 5/2008 | Lett ....................... | G06F 9/5038 718/103 |

(Continued)

OTHER PUBLICATIONS

Intel Corporation, "Performance Testing Application Device Queues (ADQ) with Aerospike", Intel Corporation, accessed on Nov. 12, 2020 (7 pages).

*Primary Examiner* — Tuan C Dao
(74) *Attorney, Agent, or Firm* — Alliance IP, LLC

(57) ABSTRACT

An apparatus comprising a network interface controller comprising a queue for messages for a thread executing on a host computing system, wherein the queue is dedicated to the thread; and circuitry to send a notification to the host computing system to resume execution of the thread when a monitoring rule for the queue has been triggered.

23 Claims, 10 Drawing Sheets

(56) References Cited

U.S. PATENT DOCUMENTS

| | | | |
|---|---|---|---|
| 2008/0183944 A1* | 7/2008 | Thornton | G06F 9/461 |
| | | | 711/6 |
| 2009/0172284 A1* | 7/2009 | Offen | G06F 12/084 |
| | | | 711/125 |
| 2011/0045599 A1* | 2/2011 | Erickson | F04B 49/106 |
| | | | 422/68.1 |
| 2012/0254982 A1* | 10/2012 | Sallam | G06F 21/566 |
| | | | 726/16 |
| 2012/0310850 A1* | 12/2012 | Zeng | G06Q 40/08 |
| | | | 705/317 |
| 2013/0007245 A1* | 1/2013 | Malik | H04W 12/37 |
| | | | 709/223 |
| 2015/0067229 A1* | 3/2015 | Connor | G06F 13/4022 |
| | | | 710/317 |
| 2015/0095580 A1* | 4/2015 | Liu | G06F 12/0811 |
| | | | 711/130 |
| 2015/0317182 A1* | 11/2015 | Serebrin | G06F 12/0813 |
| | | | 711/119 |
| 2016/0328488 A1* | 11/2016 | Lytle | G06F 16/252 |
| 2017/0046304 A1* | 2/2017 | Chen | H04L 67/1097 |
| 2017/0372442 A1* | 12/2017 | Mejias | G16H 40/20 |
| 2018/0006970 A1* | 1/2018 | Browne | H04L 49/9042 |
| 2019/0146857 A1* | 5/2019 | LeBeane | G06F 9/542 |
| | | | 719/313 |
| 2019/0339976 A1* | 11/2019 | Brewer | G06F 9/546 |
| 2020/0241927 A1 | 7/2020 | Yang et al. | |
| 2020/0322287 A1 | 10/2020 | Connor et al. | |

* cited by examiner

| MONITORING RULE ID | ADQ ID | MONITORING RULE DEFINITION | DOORBELL ADDRESS |
|---|---|---|---|
| RULE1 | ADQ1 | RATE > .5 M PACKETS/SEC | @X |
| RULE2 | ADQ2, ADQ3 | WAIT > 1 MS | @Y |
| RULE3 | ADQ4 | OCCUPANCY > 40% OR RATE > 1 M PACKETS/SEC | @RANGE Z |
| ... | ... | ... | ... |

FIG. 3

ADVANCED QUEUE MONITORING SYSTEM

BACKGROUND

Application Device Queueing (ADQ) may refer to a computing technique in which one or more queues of a network interface controller are dedicated to a particular execution thread (e.g., of an application or virtualized execution environment (VEE) such as a bare-metal function, container, or virtual machine). These queues can be exclusively accessed by the respective execution threads. ADQ may prevent network traffic contention caused by different applications or VEEs attempting to access the same queue. ADQ may also provide quality of service (QoS) control for dedicated application traffic queues for received packets or packets to be transmitted.

BRIEF DESCRIPTION OF THE DRAWINGS

FIG. 3 illustrates a configuration for a queue monitoring system in accordance with certain embodiments.

Like reference numbers and designations in the various drawings indicate like elements.

DETAILED DESCRIPTION

Figure 1:
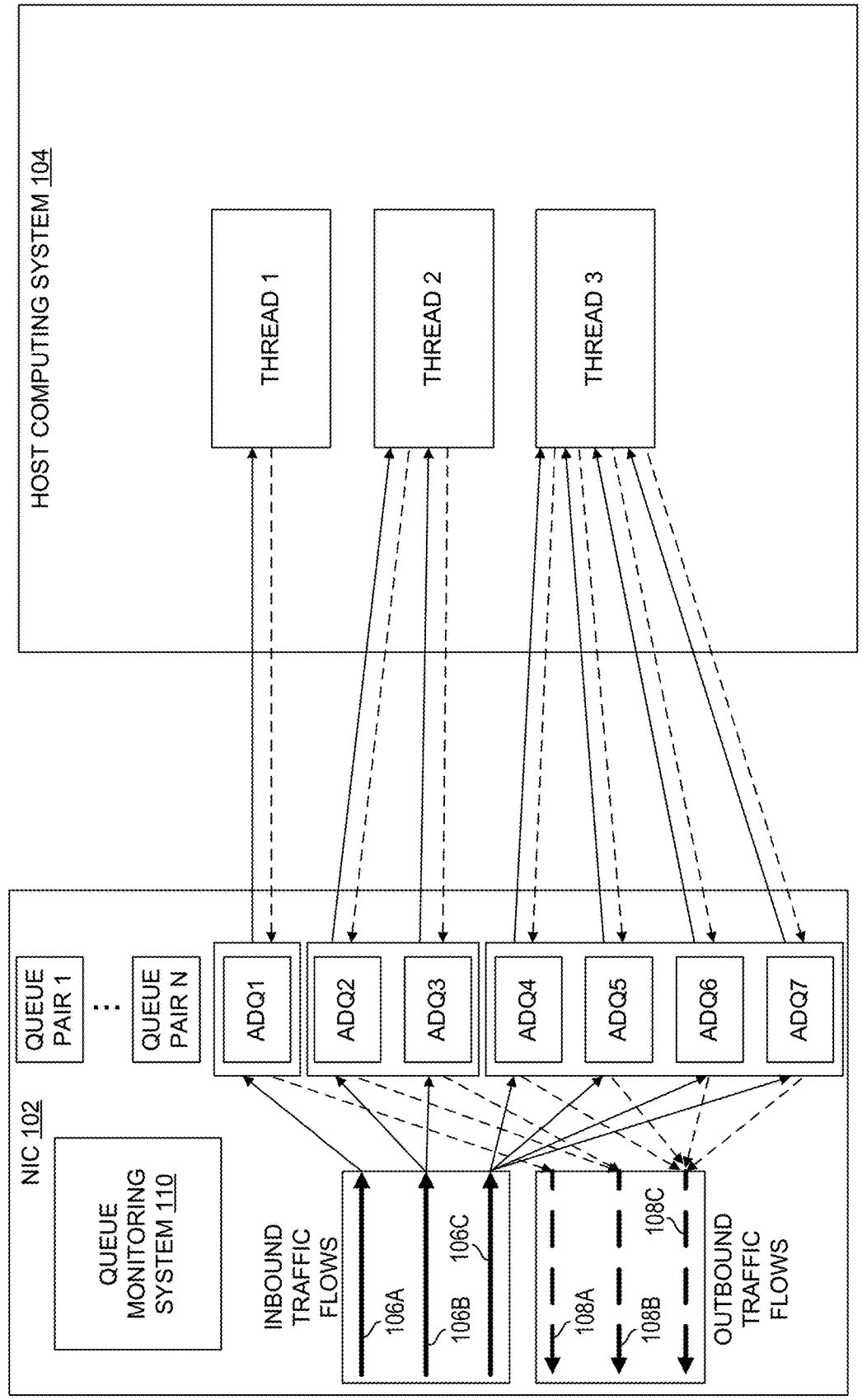
FIG. 1 illustrates a computing environment utilizing application device queues and a queue monitoring system in accordance with certain embodiments.

FIG. 1 illustrates a computing environment 100 utilizing application device queues (ADQs) in accordance with certain embodiments. Environment 100 includes network interface controller 102 and host computing system 104. NIC 102 includes various ADQs as well as general purpose queue pairs (e.g., queue pair 1, queue pair N) that are not ADQs (e.g., they are not dedicated to a particular application). Various embodiments may include any number of ADQs or general purpose queue pairs. The ADQs and queue pairs may be implemented using any suitable memory elements.

In various embodiments, an ADQ may comprise a queue for incoming packets, a queue for outgoing packets, or both (e.g., a queue pair). Herein reference to packets may refer to the packets themselves or information associated with the packets (e.g., packet descriptors, messages derived from or related to the packets, memory locations of the packets, etc.). Each ADQ may be dedicated to a thread executing on host computing system 104. In some embodiments, a range of ADQs may be dedicated to a single thread or an ADQ or range of ADQs may be dedicated to a plurality of threads (e.g., of the same application). In various embodiments, an ADQ may be dedicated to a thread, socket, application, micro-thread, process or any suitable logical entity. When an ADQ is dedicated to a particular thread (or other logical entity), it may only store packets received by NIC 102 that are destined for that thread (or logical entity) and/or packets from that thread (or logical entity) that are to be sent by the NIC 102. When an ADQ is bound to a thread, a single producer-consumer model from the thread to the ADQ is enabled.

In the embodiment depicted, ADQ1 is dedicated to thread 1, ADQ2 and ADQ3 are dedicated to thread 2, and ADQ4 through ADQ7 are dedicated to thread 3. The outgoing packets placed in ADQ1 may be communicated in a first outbound traffic flow 108A, the outgoing packets placed in ADQ1 and ADQ2 may be communicated in a second outbound traffic flow 108B, and outgoing packets placed in ADQ4 through ADQ7 may be communicated in a third outbound traffic flow 108C. Similarly, packets from a first incoming traffic flow 106A may be placed in ADQ1 for thread 1, packets from a second incoming traffic flow 106B may be placed in ADQ2 and ADQ3 for thread 2, and packets from a third incoming traffic flow 106C may be placed in ADQ4 through ADQ7 for thread 3. In some embodiments, when a plurality of ADQs are assigned to a particular thread, each of the assigned ADQs may be used to carry a different class of traffic for the thread.

With the rapid growth in microservices, containerization, and other virtualization technologies (e.g., Dockers, Kubernetes, AWS Firecracker) as well as cloud computing, multitenancy within computing systems is becoming more common. For example, a particular computing system may run several virtual machines, and each virtual machine may run one or more containers. These containers as well as other applications may be communicating over a network and sharing network resources (such as one or more NICs of the computing system). ADQs may collectively filter or rate limit traffic that comes and goes to the network based on threads. In various embodiments, the ADQs can help streamline network traffic flows for different threads and avoid head of line blocking problems and security problems (e.g., denial of service attacks).

With the use of ADQ, a thread of an application, container, or other virtualized environment may be assigned dedicated network resources (e.g., one or more ADQs) and a processor unit may poll for responses received via the network resources. Thus, ADQ enables creation of dedicated pipes between threads and device queues. In some systems, the use of ADQ uses busy polling to reduce interrupts and context switching associated with the interrupts. In some systems, a processor core may perform the busy polling.

In various embodiments of the present disclosure, in order to reduce the compute resources expended polling the device queues for incoming packets, a NIC (e.g., 102) may include a queue monitoring system 110 which is operative to monitor device queues (e.g., the ADQs) based on criteria specified by the threads or another entity. When the specified criteria is met for a particular device queue, the system 110 may initiate notification of the host computing system 104 to wake up the thread so that the thread may take action with respect to one or more received packets in the device queue. Such criteria could include, for example, network traffic meeting certain injection rate criteria or device queues having occupancy above a specified threshold.

The host computing system 104 may comprise any suitable processor unit(s) to execute threads of various applications or virtualized environments (e.g., containers or VMs). For example, a processor unit may include a central processing unit, processor core, graphics processing unit, hardware accelerator, field programmable gate array, neural network processing unit, artificial intelligence processing unit, inference engine, data processing unit, or infrastructure processing unit, among others.

In one embodiments, the host computing system 104 includes a central processing unit with a plurality of processor cores that are each operable to execute threads. A processor core may be dedicated to execution of a particular thread or may execute multiple threads (e.g., in a time shared fashion). The host computing system 104 may include any suitable supporting logic, such as one or more memory controllers, I/O controllers (e.g., to communicate with NIC 102), memory, or other suitable components.

Figure 2:
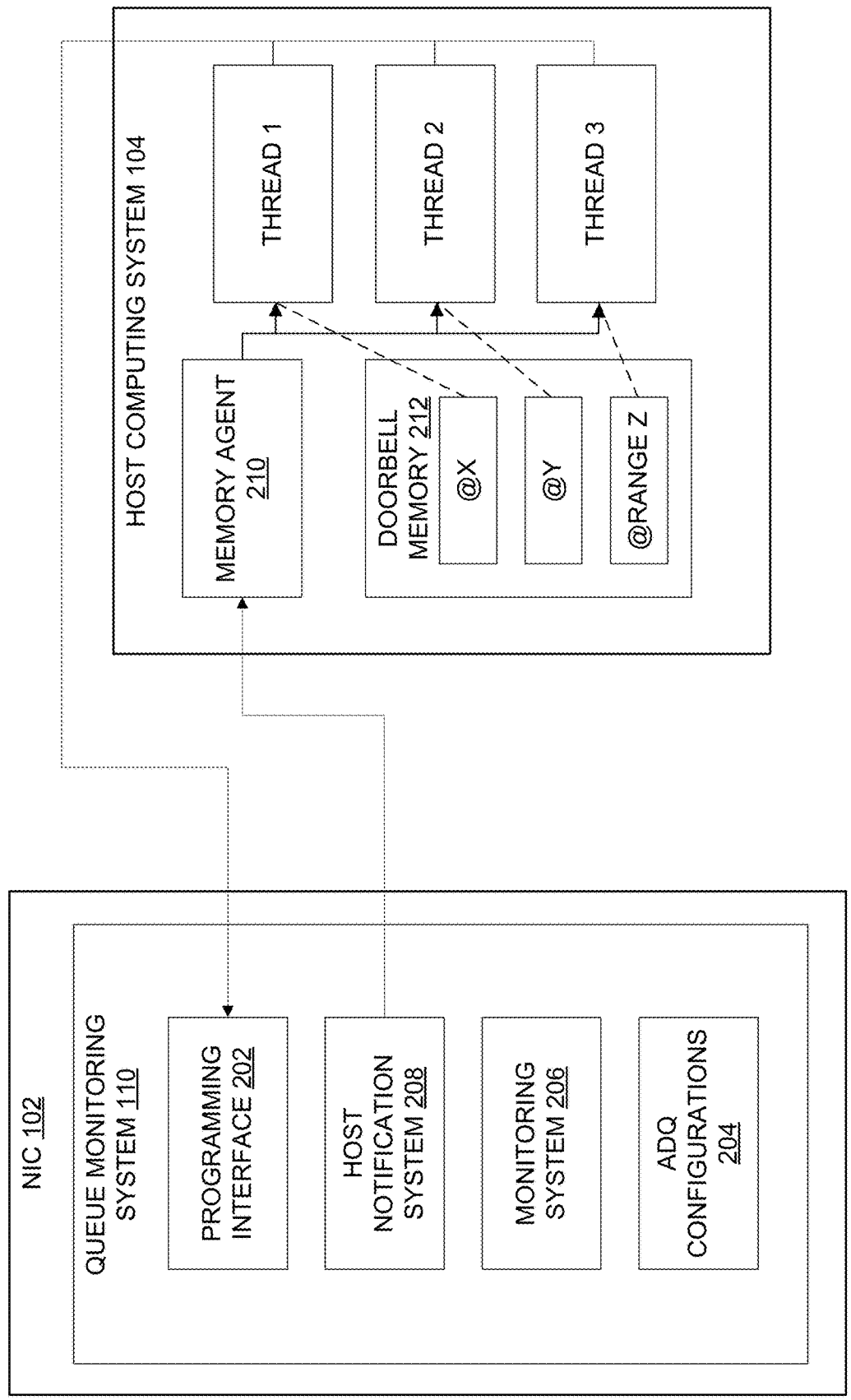
FIG. 2 illustrates the computing environment of FIG. 1 in more detail in accordance with certain embodiments.

FIG. 2 illustrates the computing environment 100 of FIG. 1 in more detail in accordance with certain embodiments. In the depicted embodiment, queue monitoring system 110 of the NIC 102 includes programming interface 202, ADQ configuration table 204, monitoring system 206, and host notification system 208. The host computing system 104 includes memory agent 210, doorbell memory 212, and threads 1, 2, and 3 which may be executed by one or more processor units (not shown).

Host computing system 104 may interact with programming interface 202 of the NIC 102 to specify a monitoring rule for a particular ADQ or range of ADQs that are dedicated exclusively to the thread. In various embodiments, the thread itself (or other software entity acting on behalf of one or more threads) may specify the monitoring rule that is to be applied to the ADQ or ADQs dedicated to the thread. The monitoring rules may be communicated to the programming interface 202 in any suitable manner. For example, the thread may provide the monitoring rule and associated information to a software driver for the NIC. The driver may be executing in user-mode in which case the thread may access the driver directly or in kernel-mode (in which case the thread may access the driver via a system call). The driver may then communicate the monitoring rule and associated information to the programming interface 202 of the NIC 102 which may include any suitable logic to communicate with the host computing system 104 and other components of the NIC 102 (e.g., ADQ configuration table 204).

When specifying a monitoring rule, a thread may specify one or more of an identifier (ID) of a monitoring rule, an ID of an ADQ, a set of IDs of ADQs, or range of ADQs to which the monitoring rule applies, the monitoring rule, and a memory address space (or range) that will be used as a doorbell (herein referred to as doorbell address) for notifications that the rule was triggered (e.g., one or more monitoring criteria specified by the rule have been met). In some embodiments, one or more of these items of information may be determined from an identification of the thread specifying the rule (as opposed to being explicitly included in a request to create a monitoring rule from a thread). For example, an ID of an ADQ dedicated to the thread may be determined by the NIC 102 when a request to create a monitoring rule is received from a thread.

In some embodiments, the request to create a monitoring rule may also include direction regarding contents of the value that should be written to the doorbell address or direction as to the particular doorbell address to write to under various conditions when a doorbell address range is specified for the monitoring rule (such embodiments are discussed in further detail below).

Programming interface 202 may also allow a thread to update a monitoring rule for an ADQ or multiple ADQs. A request to update a monitoring rule may include any of the information (or any suitable subset thereof) that may be included in a request to create a monitoring rule. In various embodiments, programming interface 202 may also allow a thread to send a notification to disable a monitoring rule, a notification to reenable a disabled monitoring rule, or a notification to delete a monitoring rule. In various embodiments, programming interface 202 may include logic to verify that an ADQ is dedicated to a particular thread before allowing the thread to add, change, or delete a monitoring rule for the ADQ (alternatively, such logic could be included on the host computing system 104), in order to prevent configuration by unauthorized threads.

ADQ configuration table 204 represent programmed monitoring rules. The ADQ configuration table 204 may be implemented using any suitable memory, such as registers, content addressable memory, static random access memory (SRAM), or other suitable memory. The programming interface 202 may program the ADQ configuration table 204 based on information in the requests received by the programming interface 202 from the threads. Programming a monitoring rule may include any suitable operations such as writing one or more values or conditions of the monitoring rule to memory of the NIC 102, configuring one or more logic gates based on the conditions specified in the monitoring rule, or other suitable configuration of software or hardware of the NIC 102.

FIG. 3 illustrates example ADQ configuration table 204 for a queue monitoring system 110 in accordance with certain embodiments. The ADQ configuration table 204 depict a plurality of monitoring rules that have been set up by various threads (e.g., thread 1, thread 2, thread 3). Each rule is associated with a monitoring rule ID, an ADQ ID, a monitoring rule definition, and a doorbell address field.

The monitoring rule ID may uniquely identify a monitoring rule among the collection of rules. The monitoring rule ID may be explicitly stored (as shown) or may be implicit (e.g., based on the location of the monitoring rule within ADQ configuration table 204). The ADQ ID uniquely identifies one or more ADQs (or ADQ range(s)) to which the monitoring rule applies. The rule definition specifies the conditions under which the monitoring rule may be triggered. For example, the rule definition may specify a Boolean rule with a list of one or more monitoring criteria and associated metrics of the NIC 102 or the one or more ADQs to which the monitoring rule applies. In some embodiments, the Boolean rule may include Boolean operators connecting pairs of monitoring criteria and associated metrics. For example, a monitoring rule may specify a triggering condition when a first metric for a first monitoring criteria is exceeded and a second metric for a second monitoring criteria is exceeded. Any suitable Boolean operators may be used to specify the triggering condition of a monitoring rule. Any suitable monitoring criteria may be specified in the monitoring rule definition. For example, the monitoring criteria may include an occupancy percentage of an ADQ, a number of requests (where the request could be, e.g., a packet or an identifier of a packet) in an ADQ, an amount of space left in an ADQ, an injection rate of packets into the ADQ, an amount of time a request has been in the ADQ, an amount of time an occupancy level has been exceeded in the ADQ, or other suitable criteria associated with the ADQ. Similarly, such monitoring criteria (or other suitable monitoring criteria) could apply to a group of ADQs or to the NIC 102 itself (e.g., injection rate of packets into a buffer of the NIC 102 rather than into an individual ADQ).

The doorbell address field includes an address (or a range of addresses) that is to be written to when the associated monitoring rule is triggered. This write operation will function as a doorbell to notify the thread that the rule was triggered. When a range of addresses is specified, a write to any address within the range of addresses may wake the thread up.

In the embodiment depicted, a first monitoring rule has a monitoring rule ID of "RULE1", an ADQ ID of "ADQ1", a monitoring rule definition specifying a trigger when an injection rate into the ADQ is greater than 0.5 million packets per second (0.5 M packets/sec), and a doorbell address of "X". A second monitoring rule has a monitoring rule ID of "RULE2", an ADQ ID of "ADQ2" and "ADQ3", a monitoring rule definition specifying a trigger when a message is held in either ADQ2 or ADQ3 for longer than one millisecond, and a doorbell address of "Y". A third monitoring rule has a monitoring rule ID of "RULES", an ADQ ID of "ADQ4", a monitoring rule definition specifying a trigger when an occupancy of ADQ4 is greater than 40% or when an injection rate into the ADQ is greater than 1 M packets/sec, and a doorbell address specifying a range "Z" of memory addresses.

As alluded to above, in some embodiments the ADQ configuration table 204 may also include directives specifying the content to be written to the doorbell address when the monitoring rule is triggered. In various embodiments, the thread will be woken up regardless of the value that is written to the doorbell address. Accordingly, the value written may be variable in order to provide additional information to the thread. For example, the value written could include information about the state of the ADQ, range of ADQs, or the NIC (e.g., metrics for any of the monitoring criteria described above or other suitable monitoring criteria). As one example, the value could include an indication of how many requests are waiting in an ADQ. In another example, the value could include information parsed from a received packet (e.g., information from the header of the packet to aid in packet processing). In another example, the value may indicate which monitoring criteria triggered the monitoring rule (e.g., when multiple different criteria are operable to trigger the rule).

In various embodiments, as an alternative or in addition to varying the value written as the doorbell, additional information may be conveyed by writing to a specific doorbell address within the doorbell address range. For example, writing to a first address within the doorbell address range responsive to the triggering of a monitoring rule may convey information that is different than writing to a second address within the doorbell address range. For example, the particular address written to could specify which monitoring criteria triggered the monitoring rule, what traffic class a request in the ADQ belongs to, a particular value of a monitoring criteria (e.g., a first address may specify the ADQ is 20% full, a second address may specify the ADQ is 30% full, and so on). Any suitable information about one or more packets or monitoring criteria may be encoded in the value written or the doorbell address written to.

In some embodiments, more than one ADQ configuration table 204 may be implemented to enable easier addition or deletion of monitoring rules. For example, in one embodiment, primary and secondary configuration tables 204 may be used. New updates may be programmed into the secondary ADQ configuration table and a single operation may enable switching between the primary and secondary ADQ configuration tables, which can allow for atomic programming of multiple monitoring rules at once on one ADQ configuration table while traffic is actively processed using the other ADQ configuration table 204. In another example, the primary ADQ configuration table 204 may be copied into the secondary ADQ configuration table, and the secondary ADQ configuration table may be sorted based on the most used rules in order to improve performance, and then primary and secondary ADQ configuration tables may be switched atomically. In yet another example, ADQ configuration tables may be chained to create a larger logical configuration.

Referring again to FIG. 2, the NIC includes a monitoring system 206 comprising logic to monitor the monitoring criteria specified by the monitoring rules and determine whether any of the monitoring rules have been triggered. In various embodiments, the monitoring system 206 is configured specific to the monitoring rules that are currently active, such that the monitoring system 206 may change the metrics that are monitored responsive to addition, changes, or deletion of monitoring rules. The monitoring system 206 may also construct doorbell values to be written (e.g., when the doorbell values include information about the state of the NIC 102 or ADQs). When a particular ADQ is updated based on packets received by the NIC 102, the monitoring system 206 may identify one or more monitoring rules associated with the ADQ to be checked, gather metrics associated with the monitoring criteria specified by the rules, and determine whether any of the monitoring rules are triggered. In some embodiments, additionally or alternatively, the monitoring system 206 could make periodic checks on whether monitoring rules have been triggered. For example, once every ten milliseconds the monitoring system could check all of the monitoring rules to determine whether any have been triggered.

Host notification system 208 may be in communication with the monitoring system 206 and may send notifications (e.g., doorbells) to the host computing system 104 when a monitoring rule is triggered. These notifications may be addressed to the memory addresses specified by the monitoring rules. In some embodiments, when issuing the notification, the host notification system 208 may issue a Compute Express Link (CXL).cache or CXL.mem request to write to the doorbell memory 212. In other embodiments, the notification may be issued using any suitable transport mechanism (e.g., a PCI-Express request). In some embodiments, a request for occupancy may be issued in conjunction with the notification.

The method of notification may vary depending on the implementation of the doorbell memory 212. In various embodiments, the doorbell memory 212 may be placed in one or more kernel buffers, user space application buffers, or in memory that is shared between the NIC 102 and the host computing system 104 (e.g., a memory mapped I/O space dedicated to the NIC 102).

In the embodiment depicted, the host computing system 104 includes a memory agent 210. The memory agent 210 may include circuitry to monitor access requests to the doorbell memory 212 and to communicate with one or more processor units to notify the processor units when such access requests have occurred.

In one embodiment, the memory agent 210 may include a caching agent, a home agent, or a combined caching/home agent. A caching agent may be associated with one or more processor units and may process memory requests from these processor units. A caching agent may also manage coherency between its associated processing elements. For example, a caching agent may initiate transactions into coherent memory and may retain copies of data in its own cache structure. A home agent may be associated with one or more memory devices and may manage memory requests involving its associated memory devices. A home agent may be responsible for processing memory requests (e.g., received from a caching agent or an I/O device such as NIC 102) involving its associated memory device and acts as a home for part of a memory address space (e.g., a host computing system 104 may have multiple homes in a distributed address space mapping). A home agent may service coherent transactions, which may include handshaking with caching agents. A home agent may supervise a portion of the coherent memory. As such, the home agent may manage conflicts that arise among different caching agents accessing the memory space assigned to the home agent. The home agent may provide the appropriate data and ownership responses in accordance with a given transaction's flow.

In some embodiments, before a thread enters an inactive state, the thread may request execution of one or more instructions that specify that the thread should be woken up when a memory write is performed to a particular memory address or a memory address within a range of memory addresses (e.g., within the doorbell memory 212). For example, a MONITOR instruction may specify a memory location or range in which the host computing system 104 should look for writes and an MWAIT instruction may specify that the processor unit executing the thread should suspend execution of the thread until a value is written to the memory address or range specified by the MONITOR instruction. In various implementations, MWAIT and MONITOR instructions invoke action by the kernel when waking up a thread (and may be limited to execution at privilege level 0). In other embodiments, user mode instructions UMWAIT and UMONITOR may be used instead to bypass the kernel when waking up the threads responsive to a write to a location specified by the UMONITOR instruction. In general, the MWAIT instruction allows the processor unit (e.g., core) to stop instruction execution and enter an implementation-dependent optimized state until occurrence of a specified event (or any of a class of events) occurs. Following the write to the doorbell address, control in the processor unit may pass to the instruction following the MWAIT instruction.

While the thread is inactive, any suitable monitoring hardware of the host computing system 104 may watch for writes to the doorbell address(es) associated with monitoring rules for a particular thread and notify the appropriate processor unit to resume execution of the thread. For example, the caching home agent 210 may perform this function in some embodiments. In various embodiments, the caching home agent 210 may call back the appropriate thread to execution by notifying a software stack associated with the thread.

Once the thread is woken up, the thread may take any suitable action with respect to one or more messages in the ADQ or ADQs associated with the monitoring rule that was triggered (the thread may track its monitoring rules and associated ADQs and doorbell addresses so that it knows which ADQs for which monitoring rules were triggered). The actions taken on the one or more messages in the corresponding ADQ(s) may include, e.g., processing the messages in the ADQs (e.g., packets), determining whether a message should be blocked, whether to forward a message, or other suitable actions.

Once a thread is awake and has taken action with respect to one or more messages in an ADQ corresponding to the doorbell memory address, the thread may poll the NIC 102 any suitable number of times to check whether additional messages for the thread have been received in the ADQ, other ADQs dedicated to the thread, or other general purpose queues. Sometime after the polling, the thread may again arm the doorbell memory addresses associated with the thread (e.g., by requesting execution of MONITOR AND MWAIT, UMONITOR AND UMWAIT, or similar instructions or through other suitable request) and then may go back to sleep. In some situations, the thread may go back to sleep without polling after taking action on the one or more messages in the ADQ at the time of the doorbell write.

In various embodiments, the threads 1, 2, and 3 may each be running on separate processor units. In other embodiments, one or more of the threads may be running on the same processor unit.

In some embodiments, instead of the doorbell operation waking up each thread directly, various instances of an application may run on each core and may execute a single monitor/umonitor (or similar) instruction and a mwait/umwait (or similar) instruction per core. Responsive to the doorbell, the instance of the application may wake and then call the appropriate thread (e.g., 1, 2, 3, or other thread) for execution on the particular core. The determination of which thread the application calls responsive to being woken up may be based, e.g., on an internal algorithm of the application, the value written into the doorbell memory 212 (e.g., the value could be or represent an ID of the thread or address of the thread), or the doorbell memory 212 address being accessed (where different memory addresses may correspond to different threads).

Figure 4:
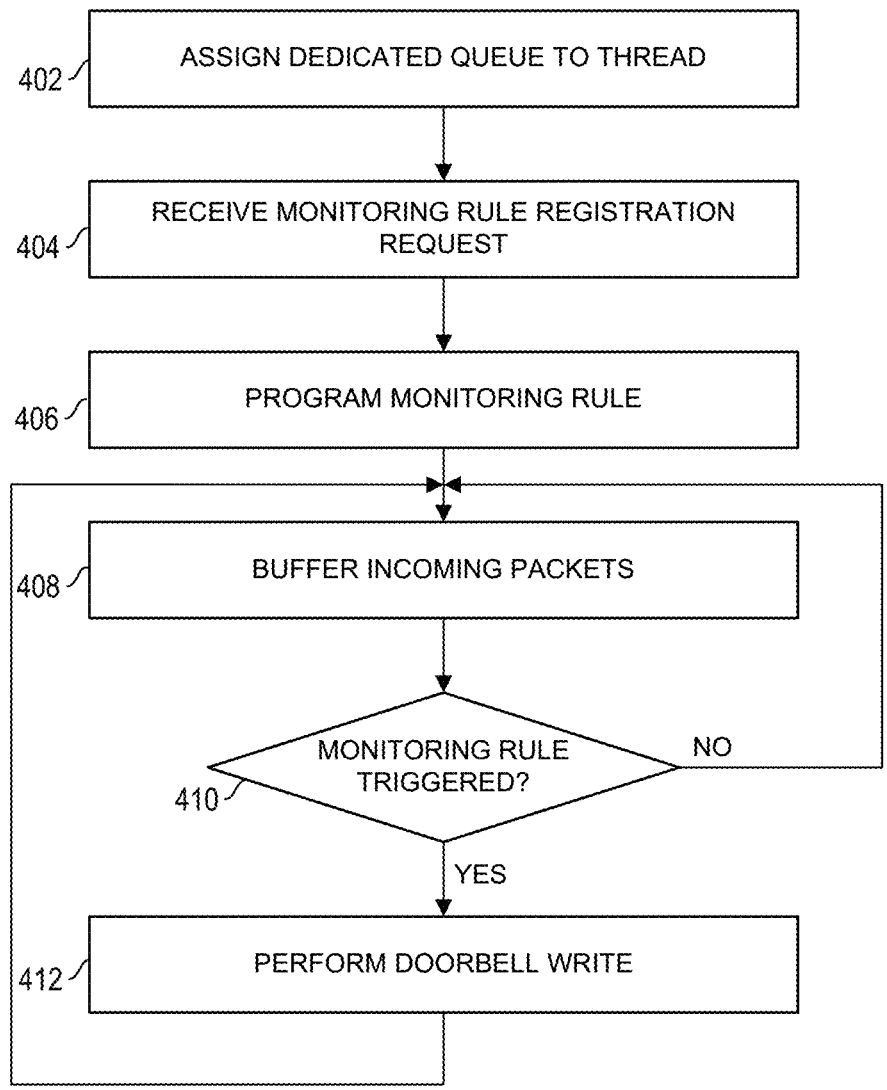
FIG. 4 illustrates a flow for monitoring queues and notifying a host computing system of triggered monitoring criteria in accordance with certain embodiments.

FIG. 4 illustrates a flow for monitoring queues and notifying a host computing system of triggered monitoring criteria in accordance with certain embodiments. The operations of the flow may be performed, e.g., by a NIC 102. At 402, a dedicated queue is assigned to a thread of a host computing system. For example, an ADQ or other suitable queue (or range of queues) of the NIC 102 may be dedicated to store incoming messages destined for the thread.

AT 404, a monitoring rule registration request is received. For example, the NIC 102 may receive this registration request from the host computing system. The request may originate from the thread (or other suitable entity on behalf of the thread). At 406, the monitoring rule is programmed into the NIC 102.

At 408, the NIC 102 buffers incoming packets. This may include placing packets in any suitable memory of the NIC 102. This may also involve updating the dedicated queues (e.g., ADQs) of the NIC 102 (e.g., by placing packets or messages associated with the received packets in the dedicated queues).

At 410, a determination as to whether the monitoring rule has been triggered is made. If the monitoring rule has not been triggered, the flow returns to 408 and additional packets are buffered. If the monitoring rule was triggered, the flow moves to 412 where a doorbell write is performed at a memory address specified by the monitoring rule. The flow may return to 408 where additional packets are buffered.

Figure 5:
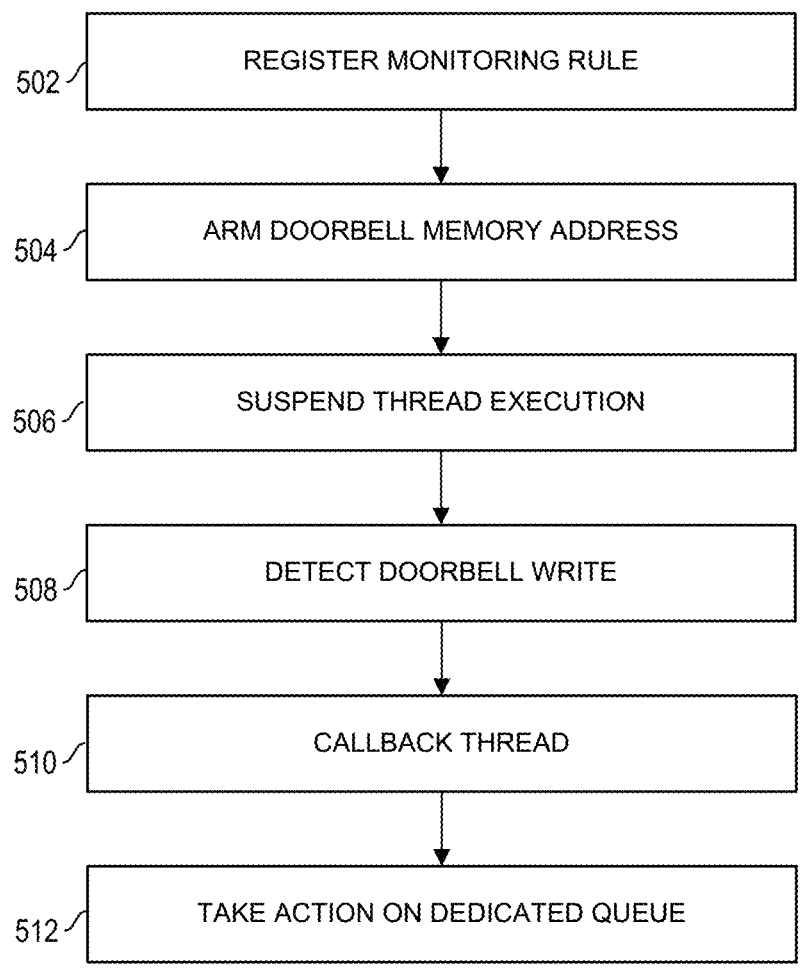
FIG. 5 illustrates a flow for programming a queue monitoring system and waking up execution threads based on triggered monitoring criteria in accordance with certain embodiments.

FIG. 5 illustrates a flow for programming a queue monitoring system and waking up execution threads based on triggered monitoring rules in accordance with certain embodiments. The operations of the flow may be performed by a host computing system 104 or other suitable logic.

At 502, a monitoring rule is registered. For example, a thread may generate a monitoring rule for one or more of its dedicated queues and request that the rule be sent to the NIC 102. After the monitoring rule has been registered, the host computing system 104 may arm one or more doorbell memory addresses specified by the monitoring rule at 504. Arming a memory address may include configuring logic of the host computing system 104 to wake up the thread when the armed memory address is written to. Once the memory address is armed, the execution of the thread may be suspended at 506 (in other words, the thread may go to sleep and the processor unit executing the thread may pause execution of the instructions of the thread).

At 508 a doorbell write to the armed memory address is detected. Responsive to the detection, a callback may be made to the thread to cause the thread to wakeup (e.g., resume execution) at 510. Action may then be taken on the corresponding dedicated queue corresponding to the monitoring rule associated with the doorbell memory address. For example, messages from the queue may be retrieved, processed, dropped, or otherwise acted upon.

The following FIGS. depict systems and components that may be used in conjunction with the embodiments described above. For example, the systems or components depicted in the Following FIGS. may implement the host computing system 104 or network interface controller 102. For example, the network interface controller 102 may correspond to network interface 650 or network interface 1000 while any of the other components of FIG. 6 may be part of or coupled to host computing system 104. As another example, a rack (e.g., 702, 902) or sled (e.g., 704) may include a host computing system 104 and/or a network interface controller 102.

Figure 6:
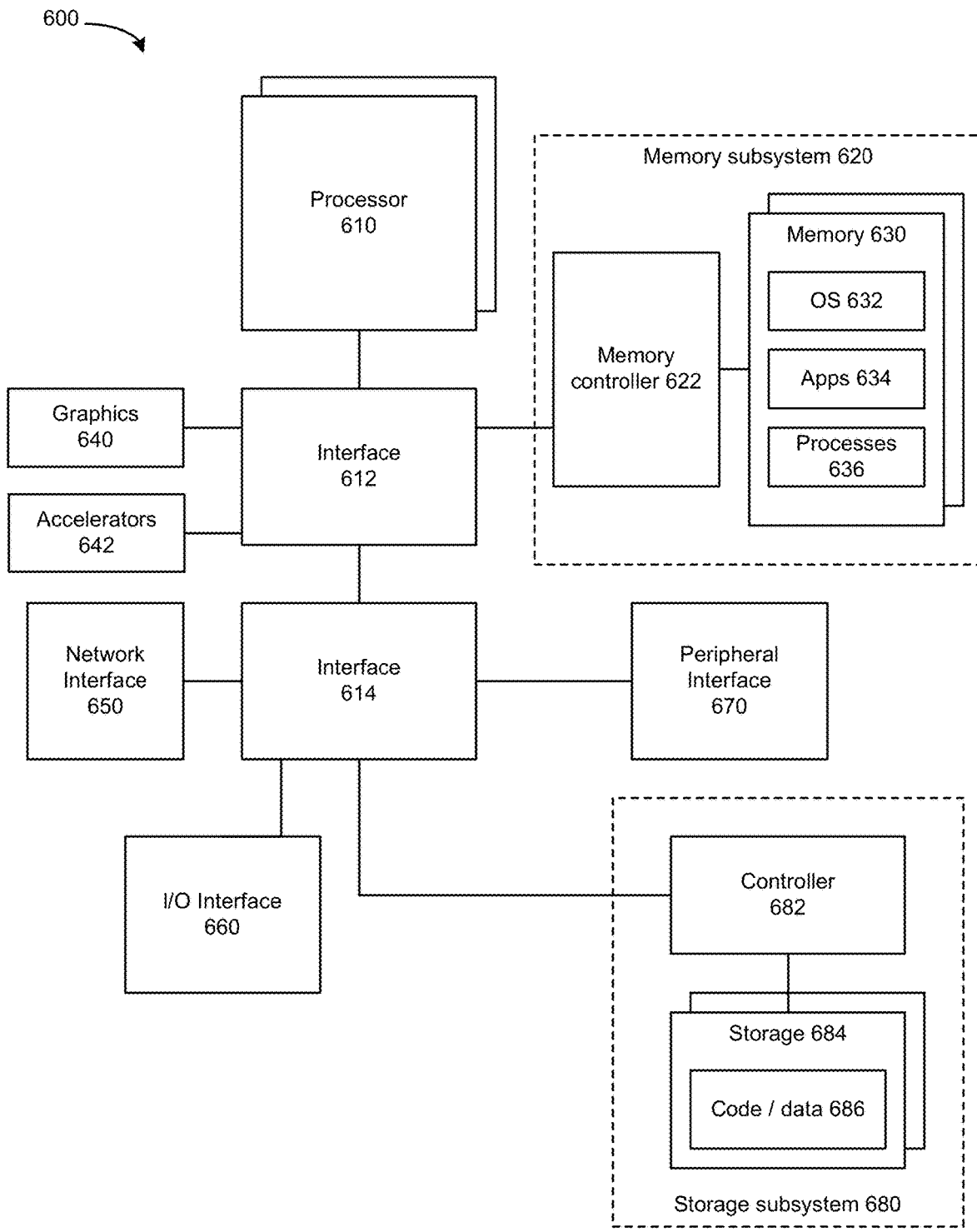
FIG. 6 illustrates an example computing system in accordance with certain embodiments.

FIG. 6 depicts an example computing system. System 600 includes processor 610, which provides processing, operation management, and execution of instructions for system 600. Processor 610 can include any type of microprocessor, central processing unit (CPU), graphics processing unit (GPU), processing core, or other processing hardware to provide processing for system 600, or a combination of processors. Processor 610 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 600 includes interface 612 coupled to processor 610, which can represent a higher speed interface or a high throughput interface for system components that needs higher bandwidth connections, such as memory subsystem 620 or graphics interface components 640, or accelerators 642. Interface 612 represents an interface circuit, which can be a standalone component or integrated onto a processor die. Where present, graphics interface 640 interfaces to graphics components for providing a visual display to a user of system 600. In one example, graphics interface 640 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 640 generates a display based on data stored in memory 630 or based on operations executed by processor 610 or both. In one example, graphics interface 640 generates a display based on data stored in memory 630 or based on operations executed by processor 610 or both.

Accelerators 642 can be a fixed function offload engine that can be accessed or used by a processor 610. For example, an accelerator among accelerators 642 can provide compression (DC) capability, cryptography services such as public key encryption (PKE), cipher, hash/authentication capabilities, decryption, or other capabilities or services. In some embodiments, in addition or alternatively, an accelerator among accelerators 642 provides field select controller capabilities as described herein. In some cases, accelerators 642 can be integrated into a CPU socket (e.g., a connector to a motherboard or circuit board that includes a CPU and provides an electrical interface with the CPU). For example, accelerators 642 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs). Accelerators 642 can provide multiple neural networks, CPUs, processor cores, general purpose graphics processing units, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 620 represents the main memory of system 600 and provides storage for code to be executed by processor 610, or data values to be used in executing a routine. Memory subsystem 620 can include one or more memory devices 630 such as read-only memory (ROM), flash memory, one or more varieties of random access memory (RAM) such as DRAM, or other memory devices, or a combination of such devices. Memory 630 stores and hosts, among other things, operating system (OS) 632 to provide a software platform for execution of instructions in system 600. Additionally, applications 634 can execute on the software platform of OS 632 from memory 630. Applications 634 represent programs that have their own operational logic to perform execution of one or more functions. Processes 636 represent agents or routines that provide auxiliary functions to OS 632 or one or more applications 634 or a combination. OS 632, applications 634, and processes 636 provide software logic to provide functions for system 600. In one example, memory subsystem 620 includes memory controller 622, which is a memory controller to generate and issue commands to memory 630. It will be understood that memory controller 622 could be a physical part of processor 610 or a physical part of interface 612. For example, memory controller 622 can be an integrated memory controller, integrated onto a circuit with processor 610.

While not specifically illustrated, it will be understood that system 600 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper Transport or industry standard architecture (ISA) bus, a small computer system interface (SCSI) bus, a universal serial bus (USB), or an Institute of Electrical and Electronics Engineers (IEEE) standard 1394 bus (Firewire).

In one example, system 600 includes interface 614, which can be coupled to interface 612. In one example, interface 614 represents an interface circuit, which can include stand-alone components and integrated circuitry. In one example, multiple user interface components or peripheral components, or both, couple to interface 614. Network interface 650 provides system 600 the ability to communicate with remote devices (e.g., servers or other computing devices) over one or more networks. Network interface 650 can include an Ethernet adapter, wireless interconnection components, cellular network interconnection components, USB (universal serial bus), or other wired or wireless standards-based or proprietary interfaces. Network interface 650 can transmit data to a device that is in the same data center or rack or a remote device, which can include sending data stored in memory. Network interface 650 can receive data from a remote device, which can include storing received data into memory. Various embodiments can be used in connection with network interface 650, processor 610, and memory subsystem 620.

In one example, system 600 includes one or more input/output (I/O) interface(s) 660. I/O interface 660 can include one or more interface components through which a user interacts with system 600 (e.g., audio, alphanumeric, tactile/touch, or other interfacing). Peripheral interface 670 can include any hardware interface not specifically mentioned above. Peripherals refer generally to devices that connect dependently to system 600. A dependent connection is one where system 600 provides the software platform or hardware platform or both on which operation executes, and with which a user interacts.

In one example, system 600 includes storage subsystem 680 to store data in a nonvolatile manner. In one example, in certain system implementations, at least certain components of storage 680 can overlap with components of memory subsystem 620. Storage subsystem 680 includes storage device(s) 684, which can be or include any conventional medium for storing large amounts of data in a non-volatile manner, such as one or more magnetic, solid state, or optical based disks, or a combination. Storage 684 holds code or instructions and data 686 in a persistent state (i.e., the value is retained despite interruption of power to system 600). Storage 684 can be generically considered to be a "memory," although memory 630 is typically the executing or operating memory to provide instructions to processor 610. Whereas storage 684 is nonvolatile, memory 630 can include volatile memory (i.e., the value or state of the data is indeterminate if power is interrupted to system 600). In one example, storage subsystem 680 includes controller 682 to interface with storage 684. In one example controller 682 is a physical part of interface 614 or processor 610 or can include circuits or logic in both processor 610 and interface 614.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 600. More specifically, power source typically interfaces to one or multiple power supplies in system 600 to provide power to the components of system 600. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 600 can be implemented using interconnected compute sleds of processors, memories, storages, network interfaces, and other components. High speed interconnects can be used such as: Ethernet (IEEE 802.3), remote direct memory access (RDMA), InfiniBand, Internet Wide Area RDMA Protocol (iWARP), quick UDP Internet Connections (QUIC), RDMA over Converged Ethernet (RoCE), Peripheral Component Interconnect express (PCIe), Intel QuickPath Interconnect (QPI), Intel Ultra Path Interconnect (UPI), Intel On-Chip System Fabric (IOSF), Omnipath, Compute Express Link (CXL), HyperTransport, high-speed fabric, NVLink, Advanced Microcontroller Bus Architecture (AMBA) interconnect, OpenCAPI, Gen-Z, Cache Coherent Interconnect for Accelerators (CCIX), 3GPP Long Term Evolution (LTE) (4G), 3GPP 5G, and variations thereof. Data can be copied or stored to virtualized storage nodes using a protocol such as NVMe over Fabrics (NVMe-oF) or NVMe.

Embodiments herein may be implemented in various types of computing and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (i.e., buses) for coupling appropriate integrated circuits (ICs) and other components mounted to the board.

Figure 7:
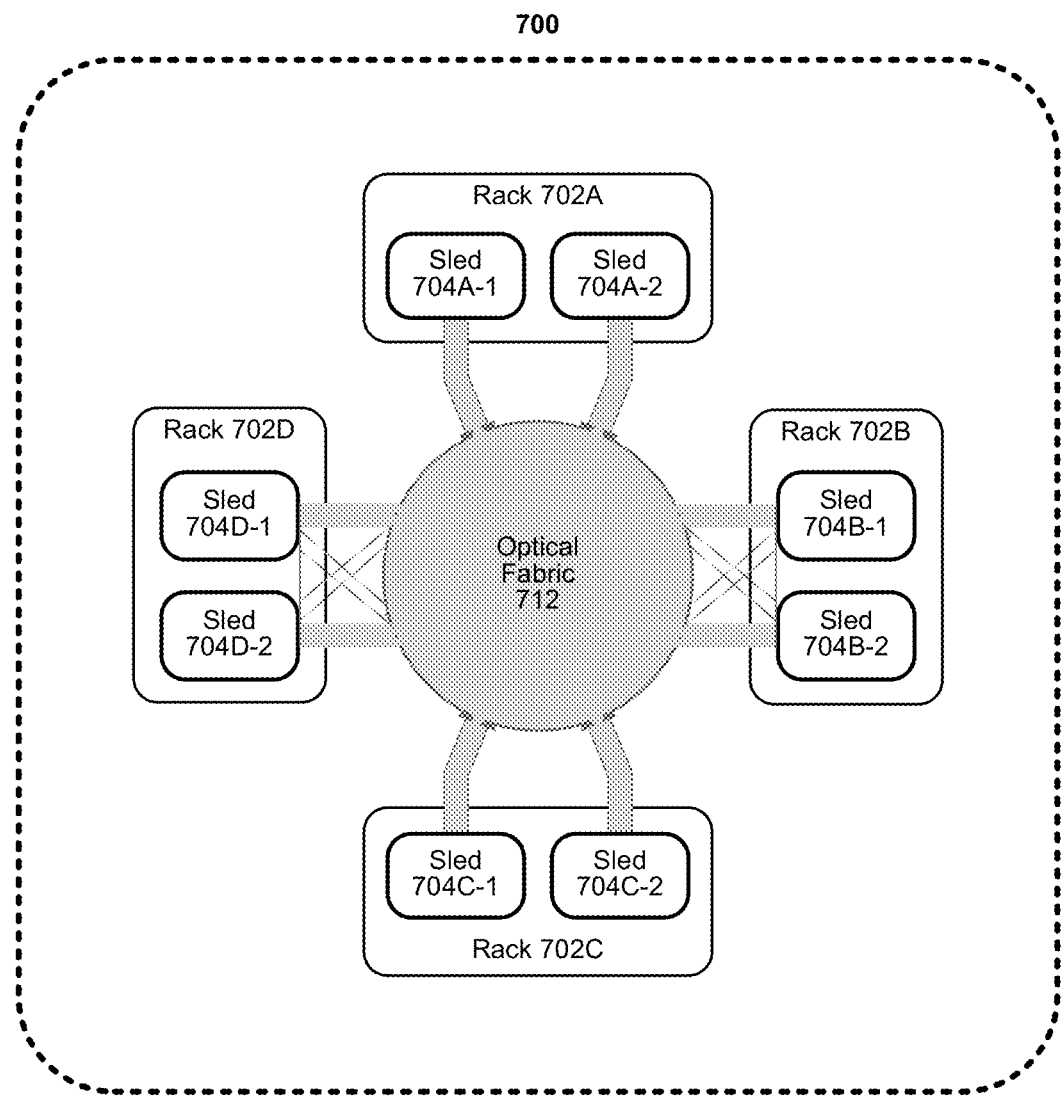
FIG. 7 illustrates an example data center in accordance with certain embodiments.

FIG. 7 depicts an example of a data center. As shown in FIG. 7, data center 700 may include an optical fabric 712. Optical fabric 712 may generally include a combination of optical signaling media (such as optical cabling) and optical switching infrastructure via which any particular sled in data center 700 can send signals to (and receive signals from) each of the other sleds in data center 700. The signaling connectivity that optical fabric 712 provides to any given sled may include connectivity both to other sleds in a same rack and sleds in other racks. Data center 700 includes four racks 702A to 702D and racks 702A to 702D house respective pairs of sleds 704A-1 and 704A-2, 704B-1 and 704B-2, 704C-1 and 704C-2, and 704D-1 and 704D-2. Thus, in this example, data center 700 includes a total of eight sleds. Optical fabric 712 can provide each sled signaling connectivity with one or more of the seven other sleds. For example, via optical fabric 712, sled 704A-1 in rack 702A may possess signaling connectivity with sled 704A-2 in rack 702A, as well as the six other sleds 704B-1, 704B-2, 704C-1, 704C-2, 704D-1, and 704D-2 that are distributed among the other racks 702B, 702C, and 702D of data center 700. The embodiments are not limited to this example.

Figure 8:
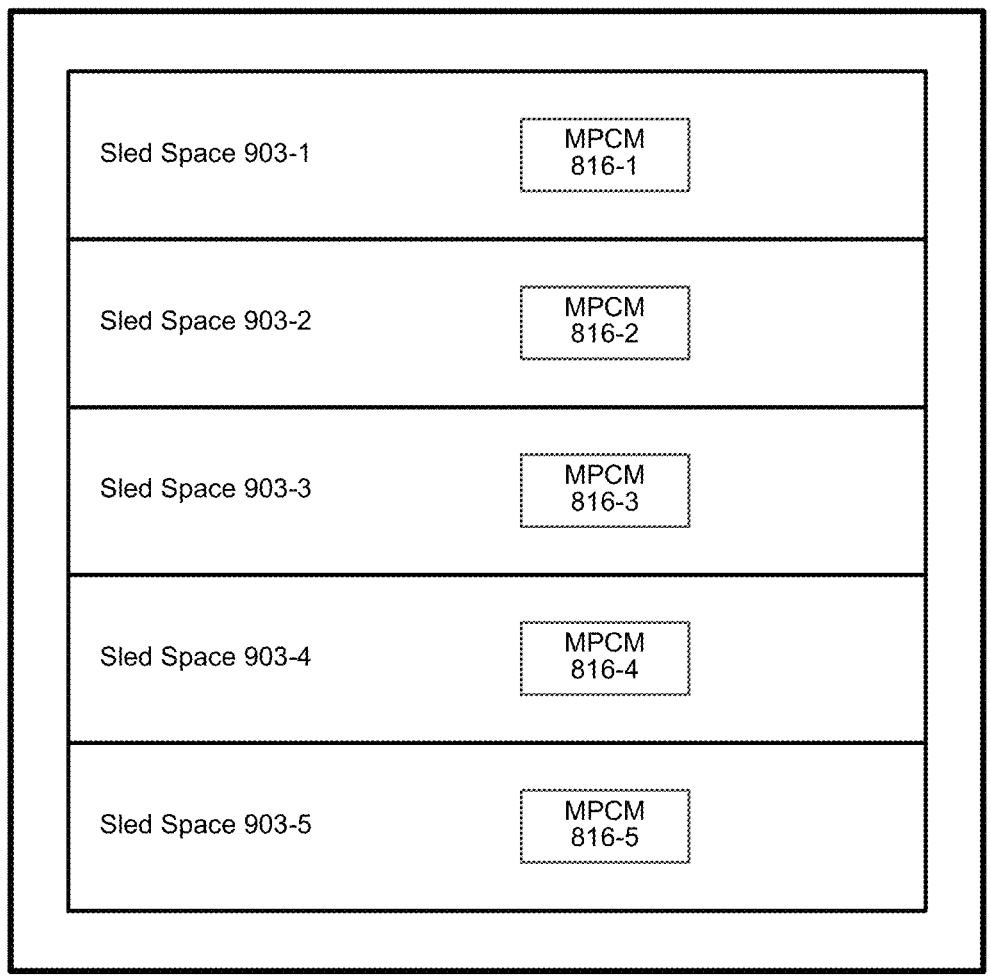
FIG. 8 illustrates an example rack architecture in accordance with certain embodiments.

FIG. 8 depicts a rack architecture such that a plurality of sled spaces can have sleds inserted. Sled spaces can be robotically-accessible via a rack access region 801. In the particular non-limiting example, rack architecture 800 features five sled spaces 803-1 to 803-5. Sled spaces 803-1 to 803-5 feature respective multi-purpose connector modules (MPCMs) 816-1 to 816-5.

Figure 9:
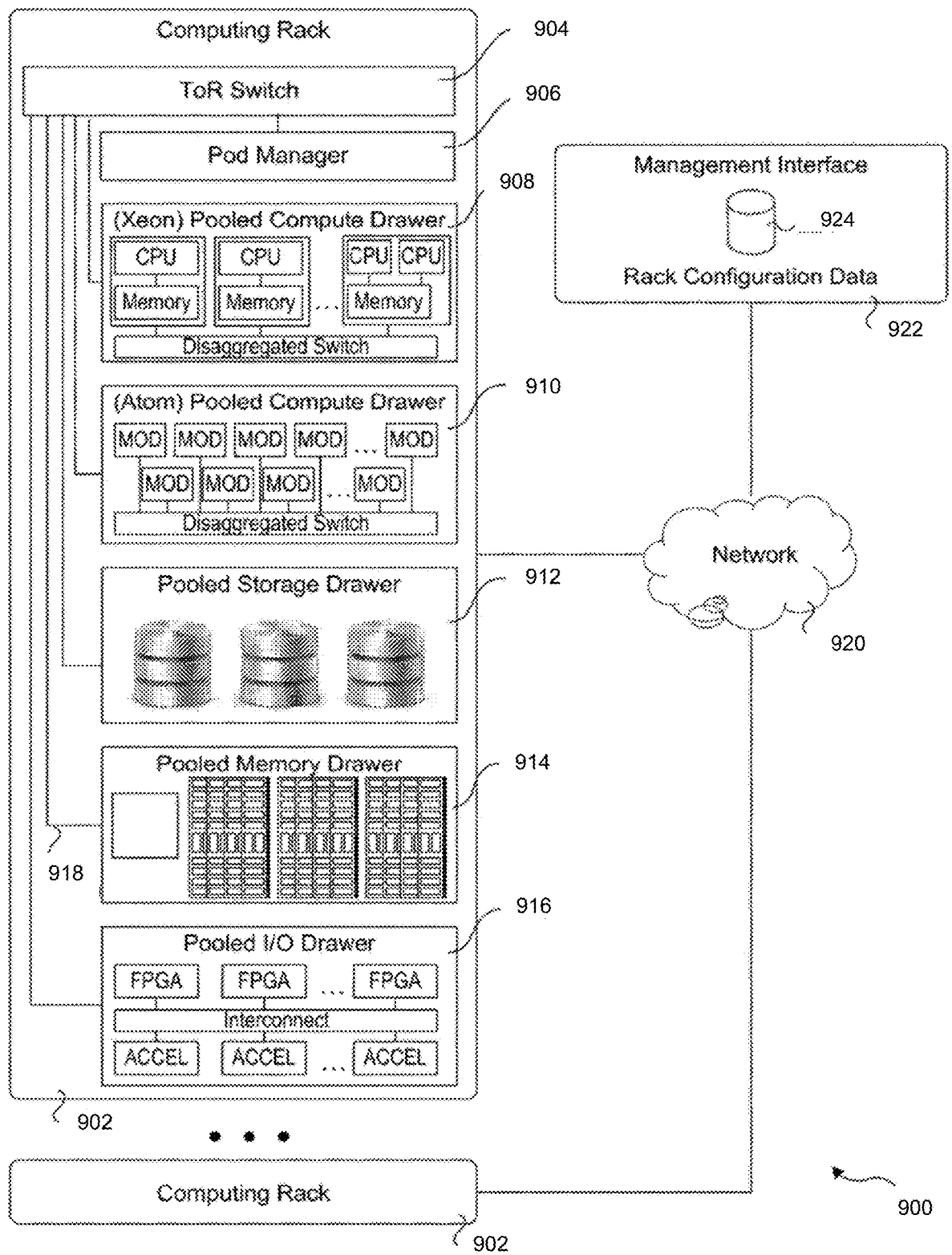
FIG. 9 illustrates an example computing environment in accordance with certain embodiments.

FIG. 9 depicts an environment 900 includes multiple computing racks 902, each including a Top of Rack (ToR) switch 904, a pod manager 906, and a plurality of pooled system drawers. Various embodiments can be used in a switch. Generally, the pooled system drawers may include pooled compute drawers and pooled storage drawers. Optionally, the pooled system drawers may also include pooled memory drawers and pooled Input/Output (I/O) drawers. In the illustrated embodiment the pooled system drawers include an Intel® XEON® pooled computer drawer 908, and Intel® ATOM™ pooled compute drawer 910, a pooled storage drawer 912, a pooled memory drawer 914, and a pooled I/O drawer 916. Each of the pooled system drawers is connected to ToR switch 904 via a high-speed link 918, such as a 40 Gigabit/second (Gb/s) or 100 Gb/s Ethernet link or a 100+ Gb/s Silicon Photonics (SiPh) optical link. In one embodiment high-speed link 918 comprises an 800 Gb/s SiPh optical link.

Multiple of the computing racks 902 may be interconnected via their ToR switches 904 (e.g., to a pod-level switch or data center switch), as illustrated by connections to a network 920. In some embodiments, groups of computing racks 902 are managed as separate pods via pod manager(s) 906. In one embodiment, a single pod manager is used to manage all of the racks in the pod. Alternatively, distributed pod managers may be used for pod management operations.

Environment 900 further includes a management interface 922 that is used to manage various aspects of the environment. This includes managing rack configuration, with corresponding parameters stored as rack configuration data 924.

Figure 10:
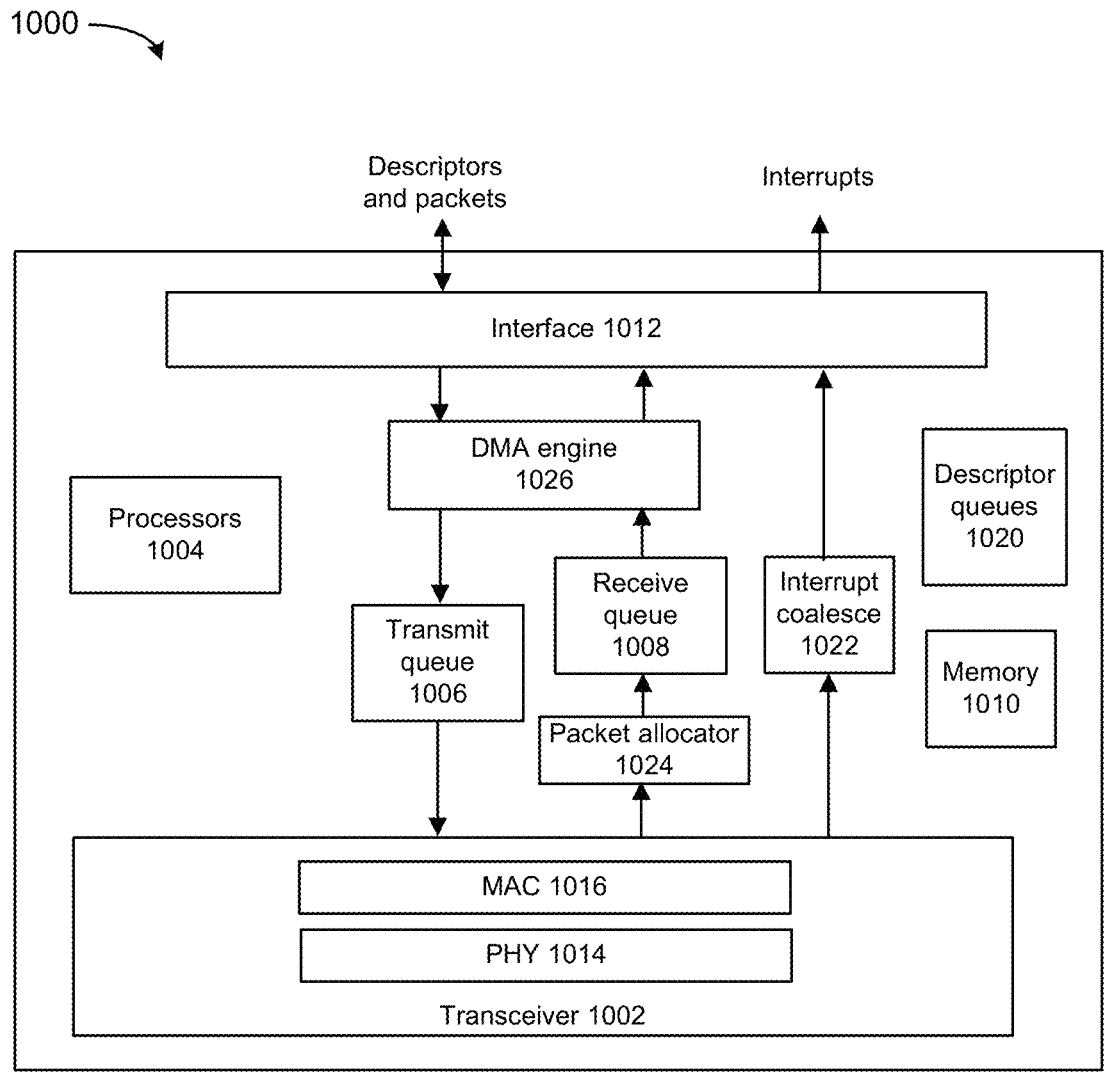
FIG. 10 illustrates an example network interface in accordance with certain embodiments.

FIG. 10 depicts a network interface that can use embodiments or be used by embodiments. Various processors of network interface 1000 can use techniques described herein to provision operating parameters of a core of processors 1004. For example, if a first core of processors 1004 performs packet processing and a second core of processor 1004 performs a power management process, the second core can modify operating parameters of the first core in accordance with embodiments described herein.

Network interface 1000 can include transceiver 1002, processors 1004, transmit queue 1006, receive queue 1008, memory 1010, and bus interface 1012, and DMA engine 1026. Transceiver 1002 can be capable of receiving and transmitting packets in conformance with the applicable protocols such as Ethernet as described in IEEE 802.3, although other protocols may be used. Transceiver 1002 can receive and transmit packets from and to a network via a network medium (not depicted). Transceiver 1002 can include physical layer (PHY) circuitry 1014 and media access control (MAC) circuitry 1016. PHY circuitry 1014 can include encoding and decoding circuitry (not shown) to encode and decode data packets according to applicable physical layer specifications or standards. MAC circuitry 1016 can be configured to assemble data to be transmitted into packets, that include destination and source addresses along with network control information and error detection hash values. MAC circuitry 1016 can be configured to process MAC headers of received packets by verifying data integrity, removing preambles and padding, and providing packet content for processing by higher layers.

Processors 1004 can be any a combination of a: processor, core, graphics processing unit (GPU), field programmable gate array (FPGA), application specific integrated circuit (ASIC), or other programmable hardware device that allow programming of network interface 1000. For example, processors 1004 can provide for allocation or deallocation of intermediate queues. For example, a "smart network interface" can provide packet processing capabilities in the network interface using processors 1004.

Packet allocator 1024 can provide distribution of received packets for processing by multiple CPUs or cores using timeslot allocation described herein or RSS. When packet allocator 1024 uses RSS, packet allocator 1024 can calculate a hash or make another determination based on contents of a received packet to determine which CPU or core is to process a packet.

Interrupt coalesce 1022 can perform interrupt moderation whereby network interface interrupt coalesce 1022 waits for multiple packets to arrive, or for a time-out to expire, before generating an interrupt to host system to process received packet(s). Receive Segment Coalescing (RSC) can be performed by network interface 1000 whereby portions of incoming packets are combined into segments of a packet. Network interface 1000 provides this coalesced packet to an application.

Direct memory access (DMA) engine 1026 can copy a packet header, packet payload, and/or descriptor directly from host memory to the network interface or vice versa, instead of copying the packet to an intermediate buffer at the host and then using another copy operation from the intermediate buffer to the destination buffer.

Memory 1010 can be any type of volatile or non-volatile memory device and can store any queue or instructions used to program network interface 1000. Transmit queue 1006 can include data or references to data for transmission by network interface. Receive queue 1008 can include data or references to data that was received by network interface from a network. Descriptor queues 1020 can include descriptors that reference data or packets in transmit queue 1006 or receive queue 1008. Bus interface 1012 can provide an interface with host device (not depicted). For example, bus interface 1012 can be compatible with peripheral connect Peripheral Component Interconnect (PCI), PCI Express, PCI-x, Serial ATA (SATA), and/or Universal Serial Bus (USB) compatible interface (although other interconnection standards may be used).

In some examples, network interface and other embodiments described herein can be used in connection with a base station (e.g., 3G, 4G, 5G and so forth), macro base station (e.g., 5G networks), picostation (e.g., an IEEE 802.11 compatible access point), nanostation (e.g., for Point-to-MultiPoint (PtMP) applications).

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disk may be the machine readable medium to store information transmitted via optical or electrical wave modulated or otherwise generated to transmit such information. When an electrical carrier wave indicating or carrying the code or design is transmitted, to the extent that copying, buffering, or retransmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

A module as used herein or as depicted in the FIGS. refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the flows described or functionality of the various systems or components described herein (e.g., 110, 202, 204, 206, 208, 210, or other components depicted in the FIGS.). "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A machine-accessible/readable medium includes any mechanism that provides (i.e., stores and/or transmits) information in a form readable by a machine, such as a computer or electronic system. For example, a machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

Example 1 may comprise an apparatus comprising a network interface controller comprising a queue for messages for a thread executing on a host computing system, wherein the queue is dedicated to the thread; and circuitry to send a notification to the host computing system to resume execution of the thread when a monitoring rule for the queue has been triggered.

Example 2 may comprise the subject matter of Example 1, wherein sending the notification comprises requesting a write operation at a memory address specified in the monitoring rule.

Example 3 may comprise the subject matter of Example 2, wherein the write operation is to specify a variable write operand that includes information associated with the triggering of the monitoring rule.

Example 4 may comprise the subject matter of any of Examples 1-3, wherein the memory address is selected from an address range specified in the monitoring rule to convey, to the thread, information associated with the triggering of the monitoring rule.

Example 5 may comprise the subject matter of any one of Examples 1-4, wherein the monitoring rule is associated with multiple queues that are respectively dedicated to the thread.

Example 6 may comprise the subject matter of any one of Examples 1-5, wherein the monitoring rule specifies an occupancy threshold of the queue.

Example 7 may comprise the subject matter of any one of Examples 1-6, wherein the monitoring rule specifies an injection rate threshold for the queue.

Example 8 may comprise the subject matter of any one of Examples 1-2, wherein the network interface controller comprises a second queue for messages for a second thread executing on the host computing system, wherein the second queue is dedicated to the second thread; and wherein the circuitry is to send a notification to the host computing system to resume execution of the second thread when a monitoring rule specified by the second thread for the second queue has been triggered.

Example 9 may comprise a system comprising a processor unit to execute a thread; and circuitry to communicate a monitoring rule for a queue of a network interface controller, the queue dedicated to the thread, the monitoring rule specifying a memory address for the network interface controller to access when the monitoring rule is triggered.

Example 10 may comprise the subject matter of Example 9, further comprising a memory including the memory address specified in the monitoring rule.

Example 11 may comprise the subject matter of any of Examples 9-10, further comprising a memory agent comprising circuitry, the memory agent to generate a notification to resume execution of the thread responsive to a detection of an access to the memory address.

Example 12 may comprise the subject matter of any of Examples 9-11, wherein the processor unit is to suspend execution of the thread after requesting arming of the memory address and to resume execution of the thread responsive to the memory address being accessed.

Example 13 may comprise the subject matter of any of Examples 9-12, wherein the thread is to process at least one incoming message of the queue responsive to the monitoring rule being triggered.

Example 14 may comprise the subject matter of any of Examples 9-13, further comprising the network interface controller.

Example 15 may comprise a method comprising dedicating a queue for messages for a thread executing on a host computing system; and sending a notification to the host computing system to resume execution of the thread when a monitoring rule for the queue has been triggered.

Example 16 may comprise the subject matter of Example 15, wherein sending the notification comprises requesting a write operation at a memory address specified in the monitoring rule.

Example 17 may comprise the subject matter of Example 16, further comprising arming the memory address prior to halting execution of the thread.

Example 18 may comprise the subject matter of any of Examples 15-17, further comprising determining whether the monitoring rule has been triggered responsive to an incoming message being placed in the queue.

Example 19 may comprise the subject matter of any of Examples 15-18, dedicating a second queue for messages for a second thread executing on the host computing system; and sending a notification to the host computing system to resume execution of the second thread when a second monitoring rule for the second queue has been triggered.

Example 20 may comprise the subject matter of Example 19, further comprising periodically determining whether the monitoring rule or the second monitoring rule has been triggered.

Example 21 may comprise a machine readable medium comprising instructions that when executed by a machine are operable to dedicate a queue for messages for a thread executing on a host computing system; and send a notification to the host computing system to resume execution of the thread when a monitoring rule for the queue has been triggered.

Example 22 may comprise the subject matter of Example 21, wherein sending the notification comprises requesting a write operation at a memory address specified in the monitoring rule.

Example 23 may comprise the subject matter of Example 22, the instructions are further operable to arm the memory address prior to halting execution of the thread.

Example 24 may comprise the subject matter of any of Examples 21-23, the instructions are further operable to determine whether the monitoring rule has been triggered responsive to an incoming message being placed in the queue.

Example 25 may comprise the subject matter of any of Examples 21-24, the instructions are further operable to dedicate a second queue for messages for a second thread executing on the host computing system; and send a notification to the host computing system to resume execution of the second thread when a second monitoring rule for the second queue has been triggered.

Example 26 may comprise the subject matter of Example 25, the instructions are further operable to periodically determine whether the monitoring rule or the second monitoring rule has been triggered.

What is claimed is:

1. An apparatus comprising:
   a network interface controller comprising:
      circuitry to manage an application device queue for packets for an application executing on a host computing system, wherein the application device queue is dedicated to the application;
      circuitry to store a monitoring rule for the application device queue, wherein the monitoring rule specifies a metric of the application device queue and a doorbell address field comprising a memory address of the host computing system; and
      circuitry to send a notification to the host computing system to write to the memory address of the doorbell address field to cause the host computing system to resume execution of a thread of the application when the monitoring rule for the application device queue has been triggered based on the metric of the application device queue.

2. The apparatus of claim 1, wherein sending the notification comprises requesting a write operation at the memory address specified in the monitoring rule.

3. The apparatus of claim 2, wherein the write operation is to specify a variable write operand that includes information associated with the triggering of the monitoring rule.

4. The apparatus of claim 2, wherein the memory address is selected from an address range specified in the doorbell address field of the monitoring rule to convey, to the thread, information associated with the triggering of the monitoring rule.

5. The apparatus of claim 1, wherein the monitoring rule is associated with multiple application device queues that are respectively dedicated to the application.

6. The apparatus of claim 1, wherein the metric of the application device queue specifies an occupancy threshold of the application device queue.

7. The apparatus of claim 1, wherein the metric of the application device queue specifies an injection rate threshold for the application device queue.

8. The apparatus of claim 1, wherein the network interface controller comprises:
   a second application device queue for packets for a second application executing on the host computing system, wherein the second application device queue is dedicated to the second application; and wherein the circuitry to send the notification is to send a second notification to the host computing system to write to a second memory address to cause the host computing system to resume execution of the second application when a second monitoring rule specified by the second application for the second queue has been triggered, wherein the second monitoring rule specifies a metric of the second application device queue and a doorbell address field comprising the second memory address.

9. A system comprising:
   a processor unit to execute an application; and
   circuitry to communicate, to a network interface controller, a monitoring rule for an application device queue of the network interface controller, the application device queue dedicated to the application, the monitoring rule specifying a metric of the application device queue and a doorbell address field comprising a memory address for the network interface controller to write a doorbell notification to when the monitoring rule is triggered based on the metric, wherein the processor unit is to resume executing a thread of the application responsive to the doorbell notification.

10. The system of claim 9, further comprising a memory including the memory address specified in the monitoring rule.

11. The system of claim 9, further comprising a memory agent comprising circuitry, the memory agent to generate a notification to resume execution of the thread of the application responsive to a detection of the writing of the doorbell notification to the memory address.

12. The system of claim 9, wherein the processor unit is to suspend execution of the thread of the application after requesting arming of the memory address and to resume execution of the thread responsive to the writing of the doorbell notification to the memory address.

13. The system of claim 12, wherein the thread is to process at least one incoming packet of the application device queue responsive to the monitoring rule being triggered.

14. The system of claim 9, further comprising the network interface controller.

15. A method comprising:
   dedicating, by a network interface controller, an application device queue for packets for an application executing on a host computing system; and
   sending, by the network interface controller, a doorbell notification to the host computing system to resume execution of a thread of the application when a monitoring rule for the application device queue has been triggered, wherein the monitoring rule specifies a metric of the application device queue and a doorbell address field comprising a memory address of the host computing system to which the doorbell notification is written responsive to triggering of the monitoring rule based on the metric of the application device queue.

16. The method of claim 15, wherein sending the notification comprises requesting a write operation at the memory address of the doorbell address field specified in the monitoring rule.

17. The method of claim 16, further comprising arming the memory address of the doorbell address field prior to halting execution of the thread.

18. The method of claim 15, further comprising determining whether the monitoring rule has been triggered responsive to an incoming message being placed in the application device queue.

19. The method of claim 15, further comprising:
   dedicating a second application device queue for packets for a second thread executing on the host computing system; and
   sending a notification to the host computing system to resume execution of the second thread when a second monitoring rule for the second application device queue has been triggered.

20. The method of claim 19, further comprising periodically determining whether the monitoring rule or the second monitoring rule has been triggered.

21. One or more non-transitory computer-readable media with code stored thereon, wherein the code is executable to cause a machine to:
   execute an application;
   communicate, to a network interface controller, a monitoring rule for an application device queue managed by a network interface controller, the application device queue dedicated to the application, the monitoring rule specifying a metric of the application device queue and a doorbell address field comprising a memory address for the network interface controller to write a doorbell notification to when the monitoring rule is triggered based on the metric; and after execution of a thread of the application is suspended, resume execution of the thread of the application responsive to the doorbell notification.

22. The media of claim 21, wherein the code is executable to cause the machine to generate a notification to resume execution of the thread responsive to a detection of an access to the memory address.

23. The media of claim 21, wherein the code is executable to cause the machine to suspend execution of the thread after requesting arming of the memory address and to resume execution of the thread responsive to the memory address being accessed.

\* \* \* \* \*